US009990993B2

(12) United States Patent
McCollum et al.

(10) Patent No.: US 9,990,993 B2
(45) Date of Patent: *Jun. 5, 2018

(54) THREE-TRANSISTOR RESISTIVE RANDOM ACCESS MEMORY CELLS

(71) Applicant: Microsemi SoC Corporation, San Jose, CA (US)

(72) Inventors: John L. McCollum, Orem, UT (US); Volker Hecht, Barsinghausen (DE)

(73) Assignee: Microsemi SoC Corporation, San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/375,036

(22) Filed: Dec. 9, 2016

(65) Prior Publication Data
US 2018/0090205 A1 Mar. 29, 2018

Related U.S. Application Data

(60) Provisional application No. 62/401,875, filed on Sep. 29, 2016.

(51) Int. Cl.
*G11C 11/00* (2006.01)
*G11C 13/00* (2006.01)
*H01L 27/24* (2006.01)

(52) U.S. Cl.
CPC ...... *G11C 13/0069* (2013.01); *H01L 27/2436* (2013.01)

(58) Field of Classification Search
CPC ............ G11C 13/0004; G11C 13/0069; H01L 27/2436

(Continued)

(56) References Cited

U.S. PATENT DOCUMENTS 5,986,322 A 11/1999 McCollum et al.
8,735,211 B2 5/2014 Greeley et al.
(Continued)

FOREIGN PATENT DOCUMENTS

CN 105118528 A 12/2015
WO WO 2013019678 2/2013
(Continued)

OTHER PUBLICATIONS

PCT/US2016/066955, Notification of Transmittal of the International Search Report and the Written Opinion of the International Searching Authority, or the Declaration, Form PCT/ISA/220.
(Continued)

Primary Examiner — Huan Hoang
(74) Attorney, Agent, or Firm — Glass & Associates; Kenneth D'Alessandro; Kenneth Glass

(57) ABSTRACT

A ReRAM cell array has having at least one row and one column includes first and second complementary bit lines for each row, a word line, a p-word line, and an n-word line for each column. A ReRAM cell at each row and column of the array includes a first ReRAM device, its first end connected to the first complementary bit line of its row, a p-channel transistor, its source connected to a second end of the first ReRAM device, its drain connected to a switch node, its gate connected to the p-channel word line of its column, a second ReRAM device, its first end connected to the second complementary bit line of its row, an n-channel transistor, its source connected to a second end of the second ReRAM device, its drain connected to the switch node, its gate connected to the n-channel word line of its column.

9 Claims, 4 Drawing Sheets

(58) Field of Classification Search
USPC .......................................... 365/148, 163, 158
See application file for complete search history.

(56) References Cited

U.S. PATENT DOCUMENTS

| | | | |
|---|---|---|---|
| 9,514,817 | B1 | 12/2016 | Chang et al. |
| 9,704,573 | B1 * | 7/2017 | Hecht ................. G11C 13/0069 |
| 2006/0171200 | A1 | 8/2006 | Rinerson et al. |
| 2007/0146012 | A1 | 6/2007 | Murphy et al. |
| 2011/0001108 | A1 | 1/2011 | Greene et al. |
| 2012/0075910 | A1 | 3/2012 | Yasuda |
| 2014/0233301 | A1 | 8/2014 | Lu et al. |
| 2014/0264238 | A1 | 9/2014 | Jo |
| 2016/0078933 | A1 | 3/2016 | Peng et al. |
| 2016/0351806 | A1 * | 12/2016 | Hsieh .................... H01L 45/085 |

FOREIGN PATENT DOCUMENTS

| | | |
|---|---|---|
| WO | WO 2016144434 | 9/2016 |
| WO | WO 2017106523 | 6/2017 |

OTHER PUBLICATIONS

Patent Cooperation Treaty, "Notification of Transmittal of the International Search Report and the Written Opinion of the International Searching Authority, or the Declaration," dated Jul. 21, 2017 for PCT/US2017031795, 258 pages.

* cited by examiner

| | VB 16 | GB 22 | WL 30 | WL 34 | BL 32 | WLPP 24 | WLNP 26 | WLPP 36 | WLNP 38 |
|---|---|---|---|---|---|---|---|---|---|
| Operate | 1.5 | 0 | 0 | 0 | 0.4 | 1.0 | 0.5 | 1.0 | 0.5 |
| Erase 12a | 1.8 | 0 | 1.8 | 0 | 0 | -0.8 | 0 | 0 | 1.8 |
| Erase 14a | 1.8 | 0 | 2.5 | 0 | 1.8 | 1.8 | 2.5 | 0 | 1.8 |
| Erase 12b | 1.8 | 0 | 0 | 1.8 | 0 | 1.8 | 0 | 0 | -0.8 |
| Erase 14b | 1.8 | 0 | 0 | 2.5 | 1.8 | 1.8 | 0 | 2.5 | 1.8 |
| Pgm 12a | 0 | 1.8 | 2.5 | 0 | 1.8 | 0 | 0 | 0 | 1.8 |
| Pgm 14a | 0 | 1.8 | 1.8 | 0 | 0 | 1.8 | 1.8 | 0 | 1.8 |
| Pgm 12b | 0 | 1.8 | 0 | 2.5 | 1.8 | 1.8 | 0 | 0 | 0 |
| Pgm 14b | 0 | 1.8 | 0 | 1.8 | 0 | 1.8 | 0 | 1.8 | 1.8 |

| | VB 56 | GB 62 | WL 66 | WL 72 | BL 68 | WLPP 70 | WLPP 74 |
|---|---|---|---|---|---|---|---|
| Operate | 1.5 | 0 | 0 | 0 | 0.4 | 1.0 | 1.0 |
| Erase 52a | 1.8 | 0 | 1.8 | 0 | 0 | -0.8 | 1.8 |
| Erase 54a | 1.8 | 0 | 2.5 | 0 | 1.8 | 1.8 | 1.8 |
| Erase 52b | 1.8 | 0 | 0 | 1.8 | 0 | 1.8 | -0.8 |
| Erase 54b | 1.8 | 0 | 0 | 2.5 | 1.8 | 1.8 | 1.8 |
| Pgm 52a | 0 | 1.8 | 2.5 | 0 | 1.8 | 0 | 1.8 |
| Pgm 54a | 0 | 1.8 | 1.8 | 0 | 0 | 1.8 | 1.8 |
| Pgm 52b | 0 | 1.8 | 0 | 2.5 | 1.8 | 1.8 | 0 |
| Pgm 54b | 0 | 1.8 | 0 | 1.8 | 0 | 1.8 | 1.8 |

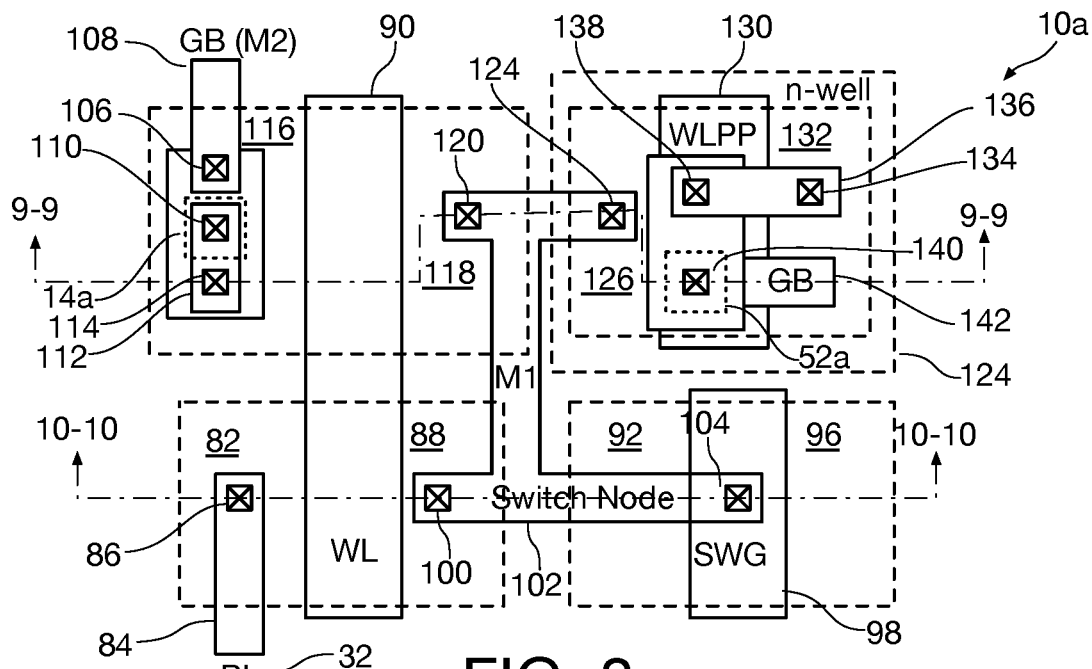

THREE-TRANSISTOR RESISTIVE RANDOM ACCESS MEMORY CELLS

CROSS REFERENCE TO RELATED APPLICATIONS

This application claims the benefit of U.S. Provisional Patent Application No. 62/401,875 filed Sep. 29, 2016, the contents of which are incorporated in this disclosure by reference in its entirety.

BACKGROUND

The present invention relates to resistive random access memory ReRAM devices and to push-pull memory cells formed from these devices. More particularly, the present invention relates to three-transistor push-pull ReRAM cells.

The contents of applications 62/268,699 entitled LOW LEAKAGE RESISTIVE RANDOM ACCESS MEMORY CELLS AND PROCESSES FOR FABRICATING SAME; 62/268,704 entitled LOW LEAKAGE ReRAM FPGA CONFIGURATION CELL; and 62/402,927 entitled THREE-TRANSISTOR RESISTIVE RANDOM ACCESS MEMORY CELLS filed on the same date of this application are expressly incorporated herein by reference in their entirety.

SUMMARY

According to one aspect of the present invention, a low-leakage resistive random access memory (ReRAM) cell includes a pair of complementary bit lines, and a switch node. A first ReRAM device has a first end connected to a first one of the complementary bit lines. A p-channel transistor has a source connected to a second end of the first ReRAM device, a drain connected to the switch node, and a gate connected to a p-word line. A second ReRAM device has a first end connected to a second one of the complementary bit lines. An n-channel transistor has a source connected to a second end of the second ReRAM device, a drain connected to the switch node, and a gate connected to an n-word line.

According to another aspect of the present invention, an array of low-leakage ReRAM cells has at least one row and at least one column. The array includes first and second complementary bit lines for each row in the array, a word line for each column in the array, a p-channel word line for each column of the array, an n-channel word line for each column of the array. A low-leakage ReRAM cell is disposed at each row and column of the array. Each ReRAM cell includes a first ReRAM device having a first end connected to the first complementary bit line of its row, a p-channel transistor having a source connected to a second end of the first ReRAM device, a drain connected to the switch node, and a gate connected to the p-channel word line of its column, a second ReRAM device having a first end connected to the second complementary bit line of its row, and an n-channel transistor having a source connected to a second end of the second ReRAM device, a drain connected to the switch node, and a gate connected to the re-channel word line of its column.

According to another aspect of the present invention, an array of low-leakage ReRAM cells has at least one row and at least one column. The array includes first and second complementary bit lines for each row in the array, a source bit line for each row in the array, a word line for each column in the array, a p-channel word line for each column of the array. A low-leakage ReRAM cell is disposed at each row and column of the array. Each ReRAM cell includes a first ReRAM device having a first end connected to the first complementary bit line of its row, an n-channel programming transistor having a source connected to the bit line of its row, a drain connected to the switch node, and a gate connected to the word line of its row, a p-channel transistor having a source connected to a second end of the first ReRAM device, a drain connected to the switch node, and a gate connected to the p-channel word line of its column, a second ReRAM device having a first end connected to the second complementary bit line of its row, an re-channel transistor having a source connected to a second end of the second ReRAM device, a drain connected to the switch node, and a gate connected to the word line of its column. The n-channel programming transistor and the n-channel transistor each have a different threshold, the threshold of the n-channel transistor being lower than the threshold of the n-channel programming transistor.

BRIEF DESCRIPTION OF THE DRAWINGS

The invention will be explained in more detail in the following with reference to embodiments and to the drawing in which are shown:

FIG. 8 is a top view of an exemplary layout drawing for a three-transistor ReRAM cell like that of FIG. 3 according to another aspect of the present invention.

FIG. 9 is a cross sectional diagram of the layout of FIG. 8 taken through dashed line 9-9.

FIG. 10 is a cross sectional diagram of the layout of FIG. 8 taken through dashed line 10-10.

DETAILED DESCRIPTION

Persons of ordinary skill in the art will realize that the following description of the present invention is illustrative only and not in any way limiting. Other embodiments of the invention will readily suggest themselves to such skilled persons.

Figures 1, 2:
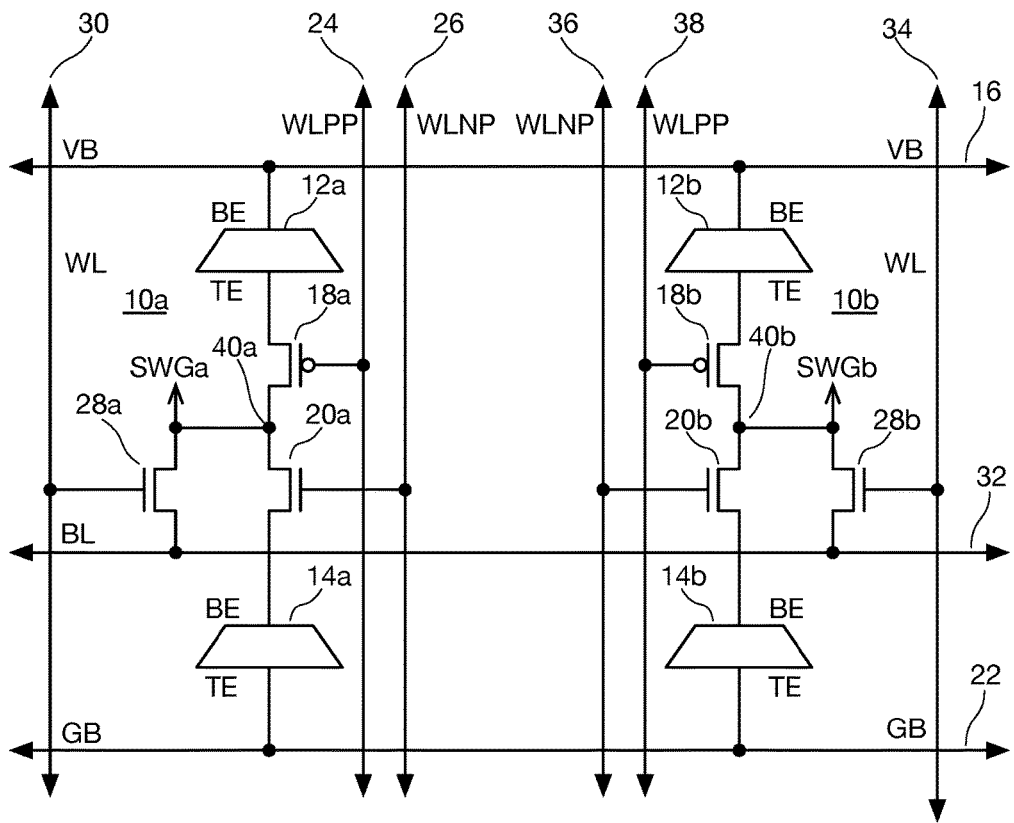
FIG. 1 is a schematic drawing of a pair of three-transistor ReRAM cells according to one aspect of the present invention.
FIG. 2 is a table showing the various voltage potentials used to operate, erase, and program the ReRAM cells of FIG. 1.

Referring first of all to FIG. 1, a schematic drawing shows a pair of three-transistor ReRAM cells according to one aspect of the present invention. Memory cell 10a and memory cell 10b are located in the same row of a ReRAM memory array. Memory cell 10a includes a pair of ReRAM devices 12a and 14a connected in push-pull configuration, the ReRAM device 12a being a pullup device and the ReRAM device 14a being a pulldown device.

In the drawing figures presented herein, the ReRAM devices are shown bearing the designations TE and BE at opposing ends thereof. The ReRAM devices disclosed herein are fabricated between two metal interconnect layers in an integrated circuit and the designation TE refers to the upper (top) one of these metal interconnect layers and the designation BE refers to the lower (bottom) one of these metal interconnect layers. The orientation of the two ReRAM devices is sometimes referred to topographically as "top" and "bottom".

The BE end of ReRAM device 12a is coupled to a potential voltage VB at VB line 16 and the TE end of ReRAM device 12a is connected through p-channel transistor 18a in series with n-channel transistor 20a to the BE end of ReRAM device 14a. The TE end of ReRAM device 14a is coupled to a potential voltage GB at GB line 22. Each of voltage potentials VB and GB are switchable between at least two values, as will be explained further below. The VB and GB lines 16 and 22 are sometimes referred to herein as complementary bit lines and are associated with the row of the memory array containing the memory cell. The VB and GB lines can be further segmented across the rows of the memory array. The gate of p-channel transistor 18a is connected to P Word line (WLPP) 24. The gate of n-channel transistor 20a is connected to N Word line (WLNP) 26. There is one P Word line (WLPP) and one N Word line (WLNP) for each column of the memory array. Voltage potentials VB and GB are in some embodiments shared among all the rows of memory array. In other embodiments, voltage potentials VB and GB are switchable over ranges of cells, with a predetermined granularity.

The common drain connection of p-channel transistor 18a and n-channel transistor 20a is connected to the drain of a programming n-channel transistor 28a at a node 40a. The gate of programming transistor 28a is connected to a word line (WL) 30 for a first column of the array and the source of n-channel programming transistor 28a is connected to a source bitline (BL) 32. There is one word line for each column of the memory array and one bitline for each row in the array.

Similarly, memory cell 10b includes a pair of ReRAM devices 12b and 14b connected in push-pull configuration, the ReRAM device 12b being a pullup device and the ReRAM device 14b being a pulldown device.

The BE end of ReRAM device 12b is coupled to the potential voltage VB at reference numeral 16 and the TE end of ReRAM device 12b is connected through p-channel transistor 18b in series with n-channel transistor 20b to the BE end of ReRAM device 14b. The TE end of ReRAM device 14b is coupled to the potential voltage GB at reference numeral 22. The gate of p-channel transistor 18b is connected to P Word line (WLPP) 38. The gate of n-channel transistor 20b is connected to N Word line (WLNP) 36.

The common drain connection of p-channel transistor 18b and n-channel transistor 20b is connected to the drain of a programming n-channel transistor 28b at a node 40b. The gate of programming transistor 28b is connected to a word line (WL) 34 for a second column of the array and the source of n-channel programming transistor 28b is connected to the source bitline (BL) 32.

FIG. 1 shows one row of a ReRAM array in accordance with this aspect of the present invention. Persons of ordinary skill in the art will appreciate that other rows in the array will be configured as shown in FIG. 1 but that each additional row will have its own unique bit line BL. In addition, such skilled persons will appreciate that additional columns of the ReRAM array will also be configured as shown in FIG. 1, but each additional column will have its own unique word line WL like WL 30 or word line 34 and its own WLNP and WLPP lines like WLNP and WLPP lines 24 and 26 and 36 and 38.

During normal circuit operation, p-channel transistors 18a and 18b and re-channel transistors 20a and 20b in their respective ReRAM cells 10a and 10b are turned on, and the output node of each ReRAM cell (the common drain connection of p-channel transistor 18a in n-channel transistor 20a indicated at reference numeral 40a in ReRAM cell 10a and the common drain connection of p-channel transistor 18b and n-channel transistor 20b indicated at reference numeral 40b in ReRAM cell 10b) is either pulled up to the voltage at VB line 16 or pulled down to the voltage line GB depending on which one of the ReRAM devices 12a or 14a in ReRAM cell 10a (or 12b or 14B in ReRAM cell 10b) are turned on. The output nodes 40a, 40b, may each be connected to a switch line SWGa and SWGb respectively to drive the gate of a switch transistor (not shown) where the ReRAM array is used to configure functions or interconnections in a programmable integrated circuit device. Persons of ordinary skill in the art will recognize that the ReRAM cells of the present invention can also be used for other purposes.

Referring now to FIG. 2, a table shows the various voltage potentials used to operate, erase, and program the ReRAM cells of FIG. 1.

The first row of the table of FIG. 2 shows the voltage potentials applied to the various control lines of the array during the normal operating mode of the array when the contents of the ReRAM cells 10a and 10b are read out. The remaining rows of the table show the potentials to apply to the various control lines to individually program or erase the ReRAM devices 12a and 14a in cell 10a and ReRAM devices 12b and 14b in cell 10b. The term program means to set the ReRAM device to on, i.e. to a low resistance, and the term erase means to set the ReRAM device to off, i.e. to a high resistance.

The programming procedure starts by erasing both ReRAM devices in each cell, followed by programming a selected one of the ReRAM devices in each cell to either pull up or pull down the switch node of each cell. As indicated in the "Operate" line of FIG. 2, VB is at a greater potential than GB during normal operation. Thus, programming ReRAM device 12a will serve to pull up output node 40a towards potential VE, thus turning on a NMOS switch whose gate is coupled to SWGa, and programming ReRAM device 14 will serve to pull down output node 40a towards potential GB, thus turning off the NMOS switch whose gate is coupled to SWGa.

Figures 3, 4:
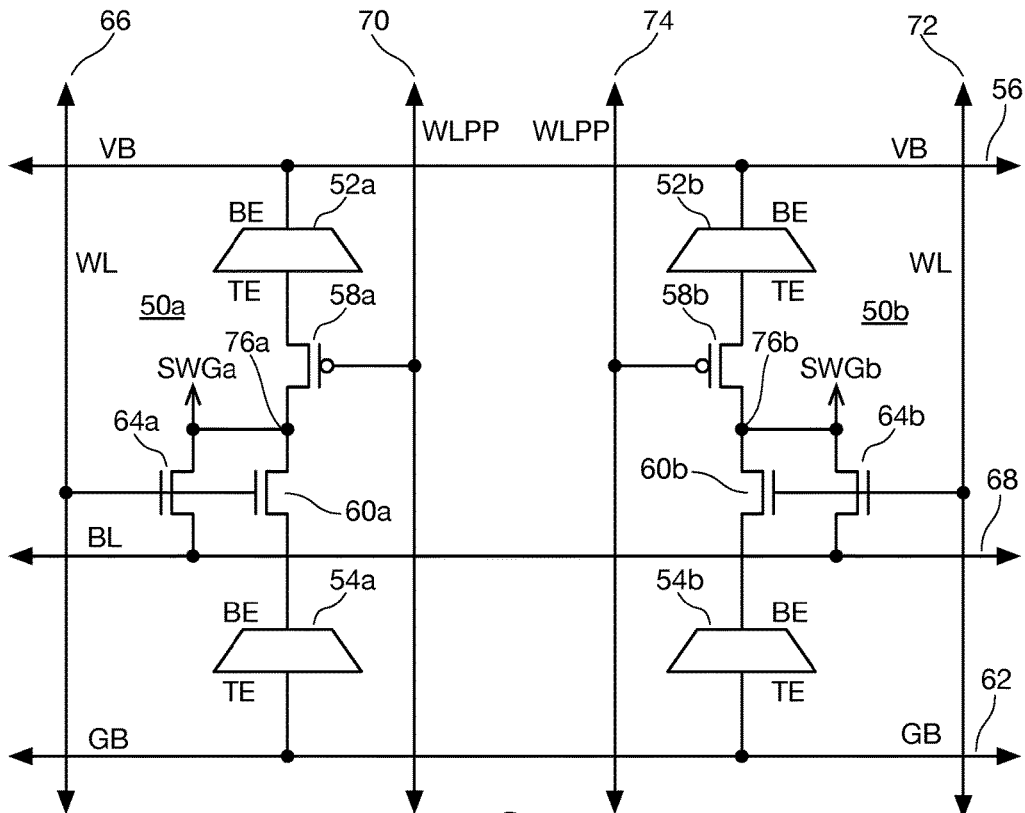
FIG. 3 is a schematic drawing of a pair of three-transistor ReRAM cells according to another aspect of the present invention.
FIG. 4 is a table showing the various voltage potentials used to operate, erase, and program the ReRAM cells of FIG. 3.

Referring now to FIG. 3, a schematic drawing shows a pair of three-transistor ReRAM cells according to another aspect of the present invention. Memory cell 50a and memory cell 50b are located in the same row of a ReRAM memory array. Memory cell 50a includes a pair of ReRAM devices 52a and 54a connected in push-pull configuration, the ReRAM device 52a being a pullup device and the ReRAM device 54a being a pulldown device.

The BE end of ReRAM device 52a is coupled to a potential voltage VB at reference numeral 56 and the TE end of ReRAM device 52a is connected through p-channel transistor 58a in series with n-channel transistor 60a to the BE end of ReRAM device 54a. The TE end of ReRAM device 54a is coupled to a potential voltage GB at reference numeral 62. During operation, voltage potential VB is more positive than voltage potential GB.

The common drain connection of p-channel transistor 58a and n-channel transistor 60a is connected to the drain of a programming n-channel transistor 64a at a node 76a. The gate of programming transistor 64a is connected to a word line (WL) 66 for a first column of the array and the source of n-channel programming transistor 64a is connected to a bitline (BL) 68. There is one word line for each column of the memory array and one bitline for each row in the array.

The gate of p-channel transistor 58a is connected to P Word line (WLPP) 70. There is one P Word line (WLPP) for each column of the memory array. The gate of n-channel transistor 60a is connected to the gate of programming transistor 64a. In this embodiment of the invention, n-channel transistor 60a has a lower threshold than programming transistor 64a and both devices can be individually controlled by the level of voltage applied to word line WL 66. A low voltage sufficient to turn on n-channel transistor 60a will not be sufficient to turn on programming transistor 64a. In this embodiment an N Word line (WLNP), as described above in relation to FIG. 1, is not utilized.

Similarly, memory cell 50b includes a pair of ReRAM devices 52b and 54b connected in push-pull configuration, the ReRAM device 52b being a pullup device and the ReRAM device 54b being a pulldown device.

The BE end of ReRAM device 52b is coupled to the potential voltage VB at reference numeral 56 and the TE end of ReRAM device 52b is connected through p-channel transistor 58b in series with n-channel transistor 60b to the BE end of ReRAM device 54b. The TE end of ReRAM device 54b is coupled to the potential voltage GB at reference numeral 62.

The common drain connection of p-channel transistor 56b and n-channel transistor 60b is connected at a node 76b to the drain of a programming n-channel transistor 64b. The gate of programming transistor 64b is connected to a word line (WL) 72 for a second column of the array and the source of n-channel programming transistor 64b is connected to the bitline (BL) 68.

The gate of p-channel transistor 58b is connected to P Word line (WLPP) 74. As previously noted there is one P Word line (WLPP) for each column of the memory array. The gate of n-channel transistor 60b is connected to the gate of programming transistor 64b. As in memory cell 50a, n-channel transistor 60b has a lower threshold than programming transistor 64b and both devices can be individually controlled by the level of voltage applied to word line WL 72. A low voltage sufficient to turn on n-channel transistor 60b will not be sufficient to turn on programming transistor 64b. An N Word line (WLNP) is not utilized for memory cell 50b. In one exemplary embodiment of the invention, the voltage threshold of programming transistors 64a and 64b is about 0.3V more or less and the voltage threshold of n-channel transistors 60a and 60b is about 0.1V more or less.

FIG. 3 shows one row of a ReRAM array in accordance with this aspect of the present invention. Persons of ordinary skill in the art will appreciate that other rows in the array will be configured as shown in FIG. 3 but that each additional row will have its own unique bit line BL. In addition, such skilled persons will appreciate that additional columns of the ReRAM array will also be configured as shown in FIG. 3, but each additional column will have its own unique word line WL like WL 66 or word line 72 and its own WLPP lines like WLPP lines 70 and 74. Voltage potentials VB and GB are in some embodiments shared among all the rows of memory array. In other embodiments, voltage potentials VB and GB are switchable over ranges of cells, with a predetermined granularity.

During normal circuit operation, p-channel transistors 58a and 58b and n-channel transistors 60a and 60b in their respective ReRAM cells 50a and 50b are turned on, and the output node 76a, 76b, respectively, of each ReRAM cell is either pulled up to the voltage at VB line 56 or pulled down to the voltage line VG 62 depending on which one of the ReRAM devices 52a or 54a in ReRAM cell 50a (or 52b or 54B in ReRAM cell 50b) are turned on. The output nodes may each be connected to a switch line SWGa and SWGb respectively to drive the gate of a switch transistor (not shown) where the ReRAM array is used to configure functions or interconnections in a programmable integrated circuit device. The sources and drains of switch transistors are sometimes referred to herein as programmable nodes. Persons of ordinary skill in the art will recognize that the ReRAM cells of the present invention can also be used for other purposes.

Referring now to FIG. 4, a table shows the various voltage potentials used to operate, erase, and program the ReRAM cells of FIG. 3. The first row of the table of FIG. 4 shows the voltage potentials applied to the various control lines of the array during the normal operating mode of the array when the contents of the ReRAM cells 50a and 50b are read out. The remaining rows of the table show the potentials to apply to the various control lines to program or erase the ReRAM devices 52a and 54a in cell 50a and ReRAM devices 52b and 54b in cell 50b.

The programming procedure starts by erasing (turning off) both ReRAM devices in each cell, followed by programming (turning on) a selected one of the ReRAM devices in each cell to either pull up or pull down the switch node of each cell.

Figure 5:
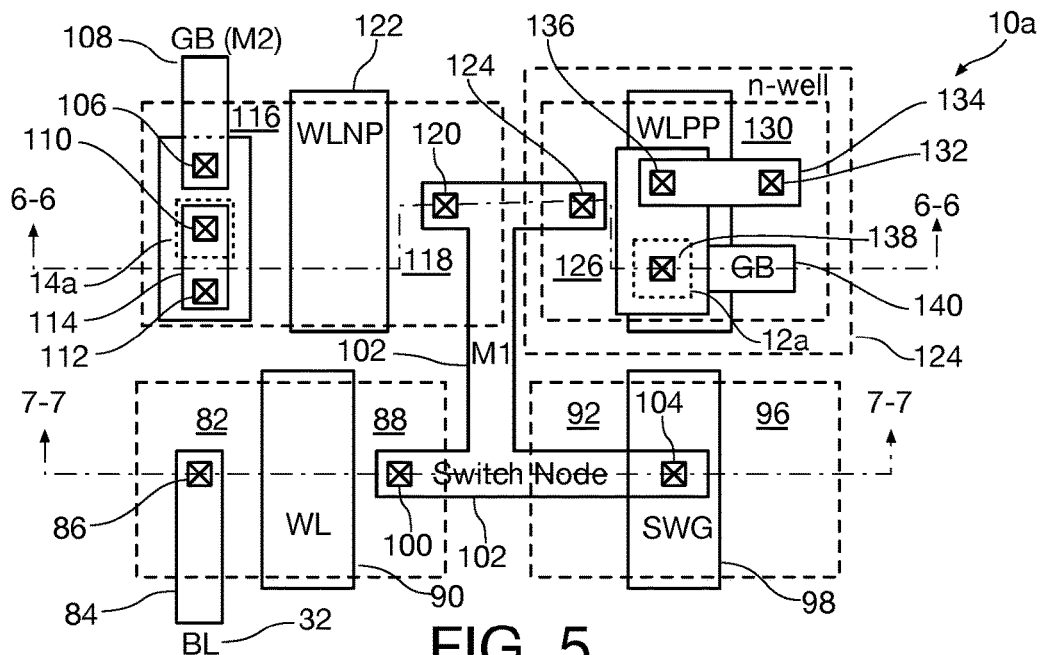
FIG. 5 is a top view of an exemplary layout drawing for a three-transistor ReRAM cell like that of FIG. 1 according to another aspect of the present invention.
Figure 6:
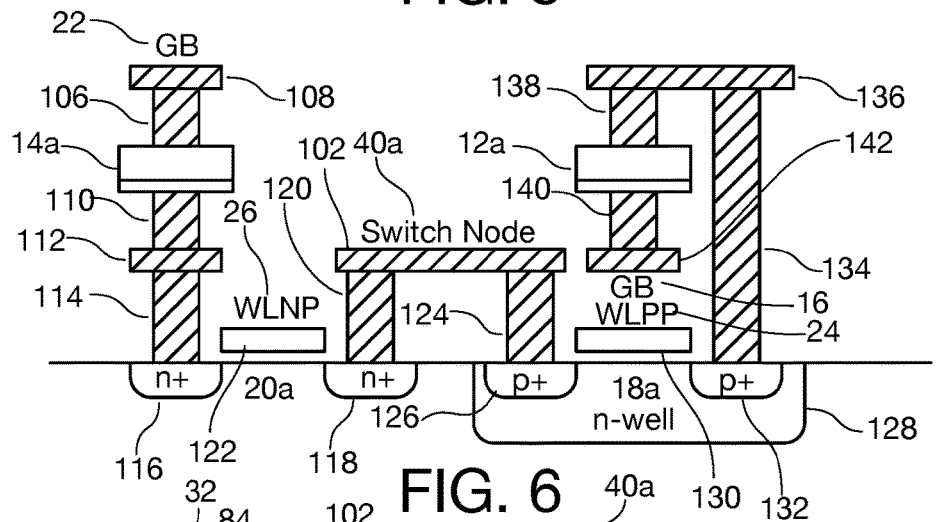
FIG. 6 is a cross sectional diagram of the layout of FIG. 5 taken through dashed line 6-6.
Figure 7:
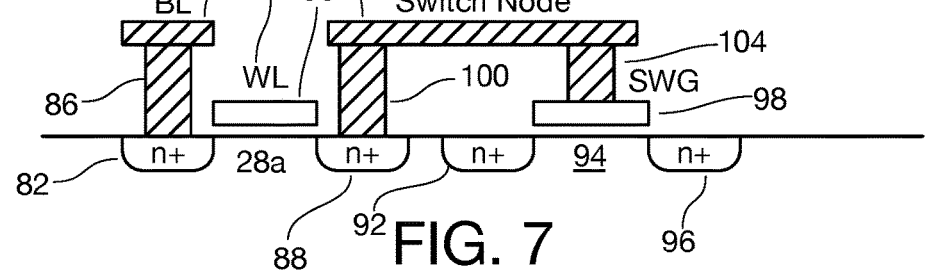
FIG. 7 is a cross sectional diagram of the layout of FIG. 5 taken through dashed line 7-7.

FIGS. 5, 6, and 7 are a top view and two different cross sectional views of an exemplary layout for the ReRAM cell 10a depicted in FIG. 1. Where appropriate, the same reference numerals used in FIG. 1 will be used to designate like structures in FIGS. 5, 6, and 7.

In the embodiment shown in FIGS. 5, 6, and 7, diffusion 82 serves as the source of programming transistor 28a and is coupled to the source bitline BL 32 at segment 84 of a first metal interconnect layer through contact 86. Diffusion 88 serves as the drain of the programming transistor 28a. Polysilicon line 90 serves as the gate of the programming transistor and as a word line WL 30. Diffusion 92 serves as the source of a switch transistor 94 coupled to the cell (not shown in FIG. 1). Diffusion 96 serves as the drain of the switch transistor 94. Polysilicon line 98 serves as the gate of the switch transistor 94.

Contact 100 connects the drain of the programming transistor 64a to a segment 102 of the first metal interconnect layer. Contact 104 connects the gate 98 of the switch transistor 94 to the segment 102 of the first metal interconnect layer. Contact 106 connects segment 108 of the second metal interconnect layer (serving as GB line 22) to the top of ReRAM device 14a (shown in dashed lines in FIG. 5). Contact 110 connects the bottom of ReRAM device 14a to segment 112 of the first metal interconnect layer. Contact 114 connects segment 112 of the first metal interconnect layer to the source diffusion 116 of the n-channel transistor 20a. The drain 118 of the n-channel transistor 20a is connected by contact 120 to the switch node 40a at the segment 102 of the first metal interconnect layer. The gate of n-channel transistor 20a is formed from polysilicon line 122, which forms or is connected to WNPP line 26.

Contact 124 connects the switch node 40a at the segment 102 of the first metal interconnect layer to the drain 126 of the p-channel transistor 18a located in n-well 128. The gate of p-channel transistor 18a is formed from polysilicon line 130, which forms or is connected to WLPP line 24. The source 132 of p-channel transistor 18a in n-well 128 is coupled by contact 134 to segment 136 of the second metal interconnect layer. Segment 136 of the second metal interconnect layer is connected to the top of ReRAM device 12a through contact 138. The bottom of ReRAM device 12a is connected through contact 140 to the voltage line GB at segment 142 of the first metal interconnect layer.

Persons of ordinary skill in the art will appreciate that FIGS. 5, 6, and 7 show a preferable "front-to-back" arrangement of ReRAM devices 12a and 14a, in which the ion source side of one ReRAM device is connected to the barrier metal side of the other ReRAM device. The embodiment shown in FIGS. 5, 6, and 7 takes slightly more layout area than a "back-to-back" arrangement, in which both ReRAM devices can be formed on the same segment of a metal line. Arranging the RRAM devices 12a and 14a in a "front-to-back" configuration, avoids the read-disturb problem (the process by which applied voltages present during normal operation cause the ReRAM device in the off (or on) state to switch to the other state).

FIGS. 8, 9, and 10 are a top view and two different cross sectional views of an exemplary layout for the ReRAM cell 50a depicted in FIG. 3. Where appropriate, the same reference numerals used in FIG. 3 will be used to designate like structures in FIGS. 8, 9, and 10. Also, because the embodiment depicted in FIGS. 8, 9, and 10 is similar to the embodiment depicted in FIGS. 5, 6, and 7, reference numerals used to designate structures in the embodiment depicted in FIGS. 5, 6, and 7 will be used to designate corresponding structures in the embodiment depicted in depicted in FIGS. 8, 9, and 10.

In the embodiment shown in FIGS. 8, 9, and 10, diffusion 82 serves as the source of programming transistor 64a and is coupled to the bitline BL 68 at segment 84 of a first metal interconnect layer through contact 86. Diffusion 88 serves as the drain of the programming transistor 64a and diffusion 82 serves as the source of programming transistor 64a. Polysilicon line 90 serves as the gate of the programming transistor 64a and as a word line WL 66. Diffusion 92 serves as the source of a switch transistor 94 coupled to the cell (not shown in FIG. 3). Diffusion 96 serves as the drain of the switch transistor 94. Polysilicon line 98 serves as the gate of the switch transistor 94.

Contact 100 connects the drain of the programming transistor 64a to a segment 102 of the first metal interconnect layer. Contact 104 connects the gate 98 of the switch transistor 94 to the segment 102 of the first metal interconnect layer. Contact 106 connects segment 108 of the second metal interconnect layer (serving as GB line 62) to the top of RRAM device 54a (shown in dashed lines in FIG. 5). Contact 110 connects the bottom of RRAM device 54a to segment 112 of the first metal interconnect layer. Contact 114 connects segment 112 of the first metal interconnect layer to the source diffusion 116 of the n-channel transistor 60a. The drain 118 of the n-channel transistor 60a is connected by contact 120 to the switch node 76a at the segment 102 of the first metal interconnect layer. Unlike the embodiment depicted in FIGS. 5, 6, and 7, the gate of n-channel transistor 64a is formed from the same polysilicon line 90 as the gate of n-channel transistor 60a.

Contact 124 connects the switch node 76a at the segment 102 of the first metal interconnect layer to the drain 126 of the p-channel transistor 58a located in n-well 128. The gate of p-channel transistor 58a is formed from polysilicon line 130, which forms or is connected to WLPP line 70. The source 132 of p-channel transistor 18a in n-well 128 is coupled by contact 134 to segment 136 of the second metal interconnect layer. Segment 136 of the second metal interconnect layer is connected to the top of ReRAM device 52a through contact 138. The bottom of ReRAM device 52a is connected through contact 140 to the voltage line GB at segment 142 of the first metal interconnect layer.

Persons of ordinary skill in the art will appreciate that, as with the embodiment shown in FIGS. 3, 4, and 5, the ReRAM devices in the embodiment shown in FIGS. 5, 6, and 7 are preferably arranged in a "front-to-back" configuration.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A low-leakage resistive random access memory (ReRAM) cell comprising:
   a pair of complementary bit lines;
   a switch node;
   a first ReRAM device having a first end connected to a first one of the complementary bit lines;
   a p-channel transistor having a source connected to a second end of the first ReRAM device, a drain connected to the switch node, and a gate connected to a p-word line;
   a second ReRAM device having a first end connected to a second one of the bit lines;
   an n-channel transistor having a source connected to a second end of the second ReRAM device, a drain connected to the switch node, and a gate connected to a word line; and
   an n-channel programming transistor having a drain connected to the switch node, a source connected to a source bit line and a fate connected to the word line;
   wherein the n-channel transistor has a first threshold voltage and the n-channel programming transistor has a second threshold voltage hither than the first threshold voltage.

2. The ReRAM cell of claim 1 further including a switch transistor having a gate connected to the switch node, a source connected to a first programmable node and a drain connected to a second programmable node.

3. The ReRAM cell of claim 1 wherein the first and second ReRAM devices are formed between a lower metal interconnect line and an upper metal interconnect line in an integrated circuit.

4. The ReRAM cell of claim 3 wherein lower metal interconnect line is a first metal interconnect line and the upper metal interconnect line is a second metal interconnect line.

5. The resistive random access memory (ReRAM) cell of claim 1 wherein the n-channel transistor has a first threshold voltage of about 0.1V and the n-channel programming transistor has a second threshold voltage of about 0.3V.

6. An array of low-leakage ReRAM cells having at least one row and at least one column, the array comprising:
   first and second bit lines for each row in the array;
   a source bit line for each row in the array;
   a word line for each column in the array;
   a p-channel word line for each column of the array;

a low-leakage ReRAM cell at each row and column of the array, each low-leakage ReRAM cell including:
  a switch node;
  a first ReRAM device having a first end connected to the first complementary bit line of its row;
  an n-channel programming transistor having a source connected to the source bit line of its row, a drain connected to the switch node, and a gate connected to the word line of its column;
  a p-channel transistor having a source connected to a second end of the first ReRAM device, a drain connected to the switch node, and a gate connected to the p-channel word line of its column;
  a second ReRAM device having a first end connected to the second complementary bit line of its row; and
  an n-channel transistor having a source connected to a second end of the second ReRAM device, a drain connected to the switch node, and a gate connected to the word line of its column;
  wherein the n-channel programming transistor and the n-channel transistor each have a different threshold, the threshold of the n-channel transistor being lower than the threshold of the n-channel programming transistor.

7. The array of claim 6 wherein each n-channel transistor has a first threshold voltage of about 0.1V and each n-channel programming transistor has a second threshold voltage of about 0.3V.

8. An array of low-leakage ReRAM cells having at least one row and at least one column, the array comprising:
  first and second bit lines for each row in the array;
  a source bit line for each row in the array;
  a word line for each column in the array;
  a p-channel word line for each column of the array;
  a plurality of low-leakage ReRAM cells, each low-leakage ReRAM cell associated with a row and a column of the array, each ReRAM cell including:
  a switch node;
  a first ReRAM device having a first end connected to the first complementary bit line of its row;
  an n-channel programming transistor having a source connected to the source bit line of its row, a drain connected to the switch node, and a gate connected to the word line of its column;
  a p-channel transistor having a source connected to a second end of the first ReRAM device, a drain connected to the switch node, and a gate connected to the p-channel word line of its column;
  a second ReRAM device having a first and connected to the second complementary bit line of its row; and
  an n-channel transistor having a source connected to a second end of the second ReRAM device, a drain connected to the switch node, and a gate connected to the word line of its column; and
  wherein the n-channel transistor has a first threshold voltage and the n-channel programming transistor has a second threshold voltage higher than the first threshold voltage.

9. The array of claim 8 wherein each n-channel transistor has a first threshold voltage of about 0.1V and each n-channel programming transistor has a second threshold voltage of about 0.3V.

* * * * *

UNITED STATES PATENT AND TRADEMARK OFFICE
CERTIFICATE OF CORRECTION

PATENT NO.         : 9,990,993 B2
APPLICATION NO.    : 15/375036
DATED              : June 5, 2018
INVENTOR(S)        : McCollum et al.

Page 1 of 1

It is certified that error appears in the above-identified patent and that said Letters Patent is hereby corrected as shown below:

In Claim 1, Column 8, Line 41, delete "fate" and insert --gate--.

In Claim 1, Column 8, Line 44, delete "hither" and insert --higher--.

Signed and Sealed this
Second Day of October, 2018

Andrei Iancu
*Director of the United States Patent and Trademark Office*